US011715660B2

(12) United States Patent
Takakuwa

(10) Patent No.: US 11,715,660 B2
(45) Date of Patent: Aug. 1, 2023

(54) POSITION MEASURING APPARATUS AND MEASURING METHOD

(71) Applicant: Kioxia Corporation, Tokyo (JP)

(72) Inventor: Manabu Takakuwa, Tsu (JP)

(73) Assignee: Kioxia Corporation, Tokyo (JP)

( * ) Notice: Subject to any disclaimer, the term of this patent is extended or adjusted under 35 U.S.C. 154(b) by 113 days.

(21) Appl. No.: 17/304,118

(22) Filed: Jun. 15, 2021

(65) Prior Publication Data

US 2022/0084864 A1    Mar. 17, 2022

(30) Foreign Application Priority Data

Sep. 15, 2020    (JP) .................................. 2020-154266

(51) Int. Cl.
*H01L 21/68*    (2006.01)
*G01B 11/00*    (2006.01)
*H01L 21/67*    (2006.01)

(52) U.S. Cl.
CPC .......... *H01L 21/682* (2013.01); *G01B 11/002* (2013.01); *H01L 21/67248* (2013.01); *H01L 21/67259* (2013.01); *H01L 21/681* (2013.01)

(58) Field of Classification Search
CPC ............ G01B 11/002; H01L 21/67248; H01L 21/67259; H01L 21/681
USPC ........................................................ 352/614
See application file for complete search history.

(56) References Cited

U.S. PATENT DOCUMENTS

| 4,650,983 | A | * | 3/1987 | Suwa | .................... G03F 9/7026 250/548 |
| 5,249,509 | A | * | 10/1993 | English | ............... A47J 31/0621 99/305 |
| 2009/0002651 | A1 | * | 1/2009 | To | ....................... G03F 7/70341 355/53 |

(Continued)

FOREIGN PATENT DOCUMENTS

JP    2006226804 A    *    8/2006
JP    4747545 B2        8/2011

(Continued)

*Primary Examiner* — Tarifur R Chowdhury
*Assistant Examiner* — Omar H Nixon
(74) *Attorney, Agent, or Firm* — Oblon, McClelland, Maier & Neustadt, L.L.P.

(57) ABSTRACT

According to one embodiment, a position measuring apparatus includes a substrate holding part, a projection part, a liquid supply part, an imaging part, a position measuring part, and a control unit. The substrate holding part is configured to hold a substrate including at least part of a circuit pattern. The projection part is configured to irradiate the substrate held on the substrate holding part with illumination light, and to transmit reflected light from the substrate, of the illumination light radiated on the substrate. The liquid supply part is configured to supply a liquid into a space between the substrate held on the substrate holding part and the projection part. The imaging part is configured to receive the reflected light transmitted through the projection part, and to generate an image signal based on the reflected light. The position measuring part is configured to obtain positional information on a position of the substrate holding part. The control unit is configured to determine a coordinate position of the at least part of a circuit pattern in the substrate, on a basis of the positional information and the image signal.

20 Claims, 5 Drawing Sheets

(56) References Cited

U.S. PATENT DOCUMENTS

| | | | |
|---|---|---|---|
| 2009/0115979 A1 | 5/2009 | Van Der Heijden et al. | |
| 2015/0160564 A1 | 6/2015 | Balan | |
| 2016/0216612 A1 | 7/2016 | Kobayashi et al. | |
| 2017/0370698 A1* | 12/2017 | Wu | G03F 1/68 |
| 2018/0046096 A1 | 2/2018 | Shibazaki | |
| 2018/0348653 A1 | 12/2018 | Kobayashi et al. | |
| 2020/0285160 A1 | 9/2020 | Shibazaki | |

FOREIGN PATENT DOCUMENTS

| | | |
|---|---|---|
| JP | 4904327 B2 | 3/2012 |
| JP | 6496734 B2 | 4/2019 |
| WO | WO 2016/136690 A1 | 9/2016 |

* cited by examiner

POSITION MEASURING APPARATUS AND MEASURING METHOD

CROSS-REFERENCE TO RELATED APPLICATIONS

This application is based upon and claims the benefit of priority from Japanese Patent Application No. 2020-154226, filed on Sep. 15, 2020; the entire contents of which are incorporated herein by reference.

FIELD

Embodiments of the present invention described herein relate generally to a position measuring apparatus and a position measuring method.

BACKGROUND

As one of the processes for manufacturing semiconductor devices, there is a photolithography process. In this process, it is necessary to perform positional alignment with high accuracy between a substrate to be etched and a photomask (which may also be referred to as "original plate"). For example, in the case of a semiconductor memory device having a three-dimensional structure, a plurality of regions formed in each chip on the substrate are in such a state that their main constituent materials are different and/or their heights from the substrate are different. Therefore, there is a case where stresses act in the chip and cause a positional shift between the memory cell region and the peripheral circuit region, for example. In this case, in order to accurately perform positional alignment of the photomask with respect to the substrate, it is necessary to correct the positional shift due to distortion. For this purpose, it is first required to accurately perform position measurement.

DETAILED DESCRIPTION

In general, according to one embodiment, a position measuring apparatus is provided. The position measuring apparatus includes a substrate holding part, a projection part, a liquid supply part, an imaging part, a position measuring part, and a control unit. The substrate holding part is configured to hold a substrate including at least part of a circuit pattern. The projection part is configured to irradiate the substrate held on the substrate holding part with illumination light, and to transmit reflected light from the substrate, of the illumination light radiated on the substrate. The liquid supply part is configured to supply a liquid into a space between the substrate held on the substrate holding part and the projection part. The imaging part is configured to receive the reflected light transmitted through the projection part, and to generate an image signal based on the reflected light. The position measuring part is configured to obtain positional information on a position of the substrate holding part. The control unit is configured to determine a coordinate position of the at least part of a circuit pattern in the substrate, on a basis of the positional information and the image signal.

Hereinafter, an embodiment according to the present invention, illustrated for non-limiting exemplification, will be explained below with reference to the accompanying drawings. The same or corresponding members or parts are denoted by the same or corresponding reference symbols in all of the accompanying drawings, and their repetitive description will be omitted. Further, the drawings are not intended to indicate relative ratios between the dimensions of members or parts, and thus their specific dimensions should be determined by a person skilled in the art in light of the following non-limiting embodiment.

Figure 1:
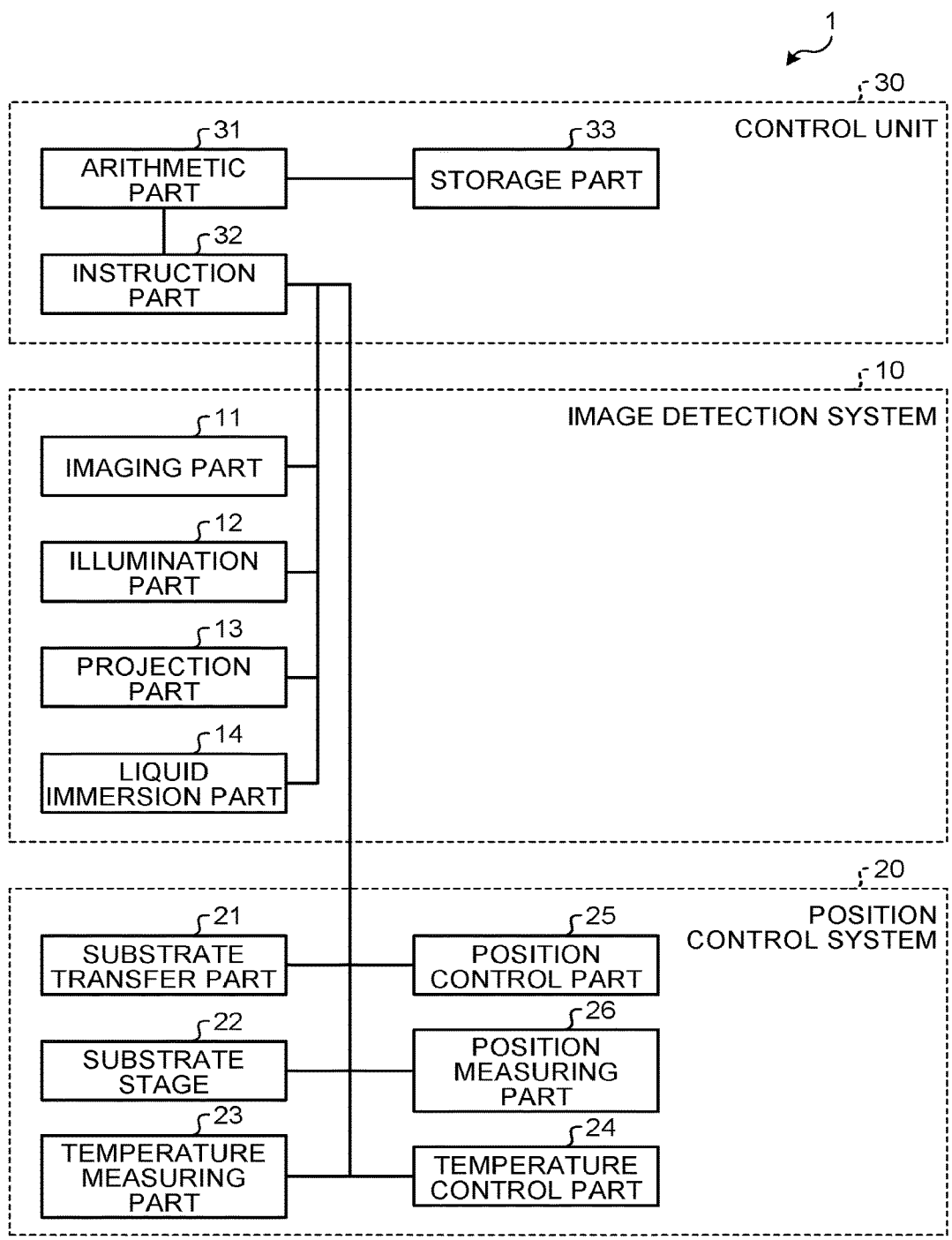
FIG. 1 is a block diagram illustrating a position measuring apparatus according to an embodiment.
Figure 2:
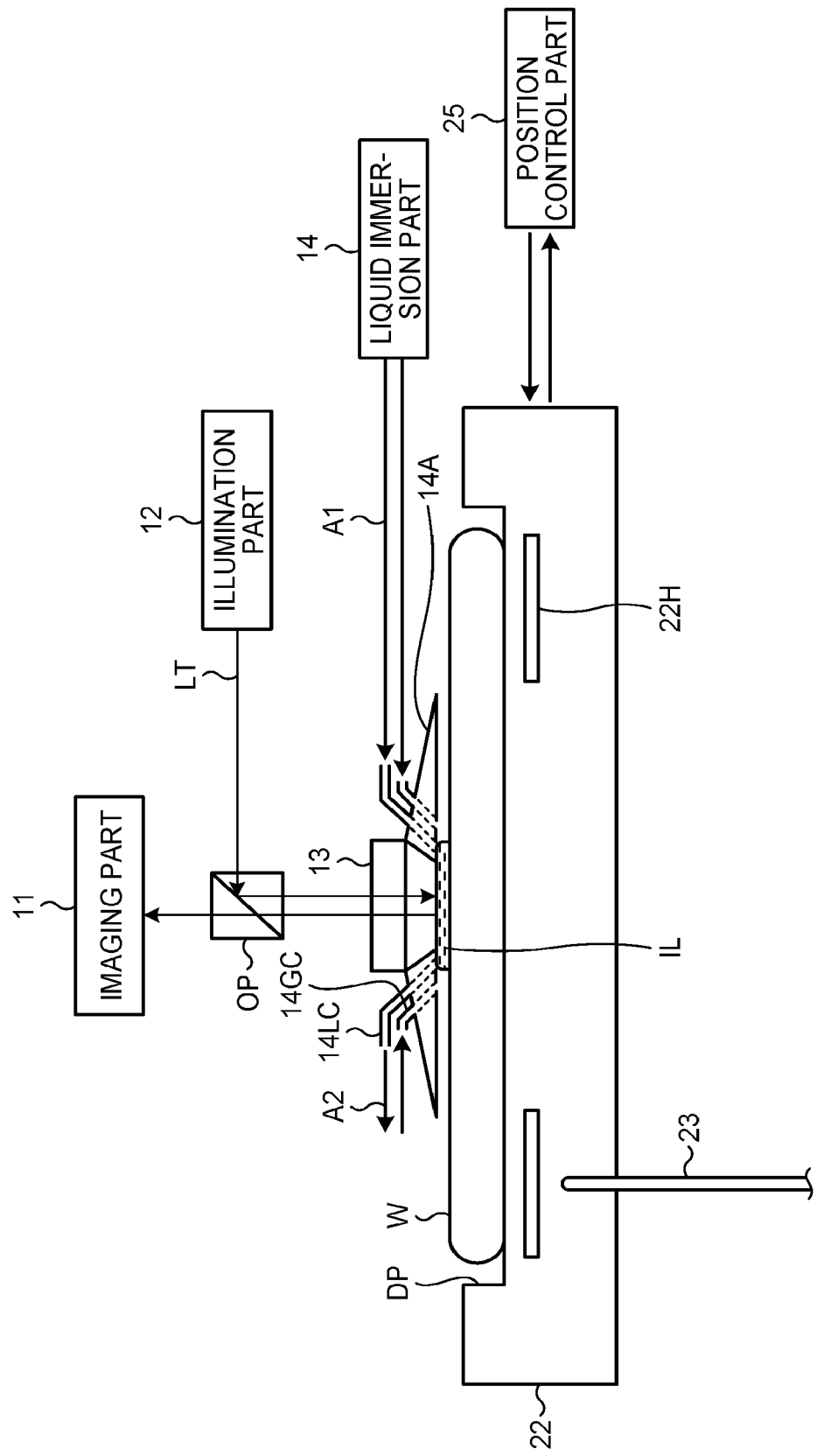
FIG. 2 is a diagram schematically illustrating a configuration of the position measuring apparatus according to the embodiment.
Figure 3:
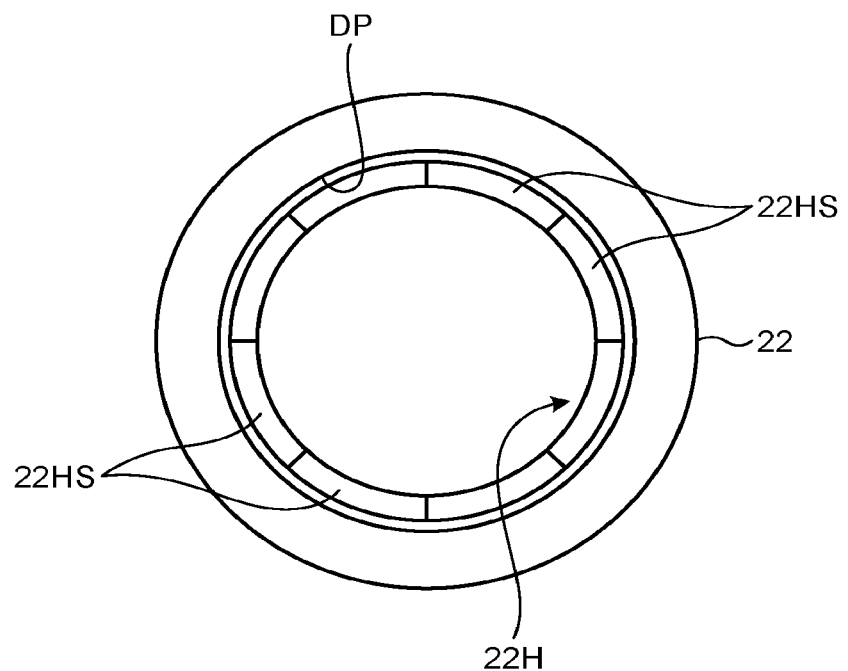
FIG. 3 is a top view schematically illustrating a substrate stage.

With reference to FIGS. 1 to 3, an explanation will be given of a position measuring apparatus according to an embodiment. FIG. 1 is a block diagram illustrating a position measuring apparatus according to an embodiment. FIG. 2 is a diagram schematically illustrating a configuration of the position measuring apparatus of FIG. 1. FIG. 3 is a top view schematically illustrating a substrate stage. As illustrated in FIG. 1, the position measuring apparatus 1 includes an image detection system 10, a position control system 20, and a control unit 30. In this embodiment, it is assumed that a substrate as a position measuring object is a semiconductor wafer made of a semiconductor, such as silicon. Hereinafter, the semiconductor wafer will be simply referred to as "wafer W".

Image Detection System

The image detection system 10 includes an imaging part 11, an illumination part 12, a projection part 13, and a liquid immersion part 14. The imaging part 11 includes, for example, an imaging device, such as a charge-coupled device (CCD) or complementary metal-oxide semiconductor (CMOS) image sensor, and generates an image signal based on incident light. The illumination part 12 may include, for example, a light source that includes a white light emitting diode (LED) or a high-pressure lamp, such as a xenon lamp, and a wavelength filter that transmits light of a predetermined wavelength. With this arrangement, the illumination part 12 can emit light LT having a predetermined wavelength as illumination light. Alternatively, a light source that emits light within a predetermined wavelength band may be used without using the wavelength filter. For example, a green light LED (with a wavelength of 500 to 570 nm) or a blue light LED (with a wavelength of 460 to 500 nm) may be used.

The projection part 13 includes an objective lens (not illustrated), and is arranged to be close to the wafer W mounted on a substrate stage 22 described later, as illustrated in FIG. 2. In this embodiment, the projection part 13 and the illumination part 12 are optically coupled by an optical component OP, such as a half mirror, provided above the projection part 13. The optical component OP reflects light, incident from a direction intersecting with the main axis, into the main axis direction, and transmits light incident from a direction parallel to the main axis.

Further, the projection part 13 is supported to be movable up and down above the substrate stage 22 by a support member (not illustrated). The support member can move the projection part 13 in a direction toward or a direction away from the wafer W mounted on the substrate stage 22, in accordance with an instruction signal from the control unit 30. Here, the support member that supports the projection part 13 may be able to move the projection part 13 in the horizontal direction.

In this embodiment, the liquid immersion part 14 includes an attachment 14A that can be attached to the projection part 13. The attachment 14A is provided with conduits 14LC for liquid and conduits 14GC for gas. In the attachment 14A, the conduits 14LC for liquid are arranged on the inner side with respect to the conduits 14GC for gas. The liquid immersion part 14 may include, for example, a liquid storage container, piping, valves, and so forth (all not illustrated), by which the liquid immersion part 14 can supply a liquid from the liquid storage container through the conduits 14LC into a space between the projection part 13 and the wafer W. Here, for example, the liquid is exemplified by pure water or a liquid having a refractive index larger than the refractive index of air at least. Further, the distance between the projection part 13 and the wafer W may be set such that the liquid supplied in the space therebetween is retained by surface tension. Here, the attachment 14A may be provided with at least two conduits 14LC to supply the liquid through one of the conduits and discharge the liquid through the other, as indicated by arrows A1 and A2 in FIG. 2. With this arrangement, it is possible to switch the state of the space between the projection part 13 and the wafer W as required between a state where the liquid is present therein and a state where the liquid is not present therein. For convenience of explanation, in the following description, the liquid to be supplied into the space between the projection part 13 and the wafer W will be referred to as "immersion liquid IL" (FIG. 2).

Further, the conduits 14GC for gas are provided to blow a gas, such as air (clean and dry air) or an inactive gas (rare gas or nitrogen gas), to the circumference of the immersion liquid IL. Specifically, the liquid immersion part 14 may include a gas cylinder filled with a gas (or a compressor), piping, valves, and so forth. With this arrangement, the liquid immersion part 14 can blow a gas or the like to the circumference of the immersion liquid IL through the conduits 14GC. Consequently, it is possible to reliably hold the immersion liquid IL between the projection part 13 and the wafer W. Here, the number of conduits 14GC may be determined arbitrarily. For example, where the attachment 14A is provided with a plurality of conduits 14GC at regular angular intervals in the circumferential direction, the gas sprayed from these conduits 14GC can be made into the form of an air curtain and thereby surround the immersion liquid IL. With this arrangement, it is possible to reliably retain the immersion liquid IL.

According to the configuration described above, the illumination light emitted from the illumination part 12 is reflected by the optical component OP toward the projection part 13, and is incident onto the projection part 13. The illumination light incident on the projection part 13 is collected onto the surface of the wafer W, and is reflected on the surface of the wafer W. This reflected light (which may include diffracted light and/or scattered light) is transmitted through the projection part 13 and the optical component OP, and is incident onto the imaging part 11. The Imaging part 11 generates an image signal based on the incident light, and sends this image signal to an arithmetic part 31 through an instruction part 32 described later. The arithmetic part 31 performs various signal processes on the received image signal to create a two-dimensional image. This two-dimensional image may include a circuit pattern of a semiconductor device or the like formed on the wafer W.

Position Control System

With reference to FIG. 1 again, the position control system 20 includes a substrate transfer part 21, a substrate stage 22, a temperature measuring part 23, a temperature control part 24, a position control part 25, and a position measuring part 26. The substrate transport part 21 may include a wafer transfer arm that transfers the wafer W in the horizontal direction, a lifting device that receives the wafer W from the wafer transfer arm and transfers the wafer W in the vertical direction, and so forth (all not illustrated). The substrate transport part 21 can load the wafer W to be measured onto the substrate stage 22 and unload the wafer W from the substrate stage 22.

On the substrate stage 22, a depressed portion DP having a diameter larger than the diameter of the wafer W is formed, so that the wafer W can be mounted therein. Further, the depressed portion DP is provided with a chuck mechanism, such as a vacuum chuck, electrostatic chuck, or mechanical chuck, by which the wafer W can be held on the substrate stage 22. Further, as illustrated in FIG. 2, the substrate stage 22 is provided with a temperature measuring part 23. The temperature measuring part 23 may be a thermocouple, for example. Alternatively, the temperature measuring part 23 may be a radiation thermometer. Further, the substrate stage 22 may be provided with a heater 22H, as illustrated in FIG. 2. In the example illustrated in FIG. 2, the heater 22H has an outer diameter approximately equal to the outer diameter of the wafer W. Further, in this embodiment, as illustrated in FIG. 3, the heater 22H may be composed of eight sub-heaters 22HS divided at equal angles in its circumferential direction. Where the temperature measuring part 23 is arranged to correspond to these sub-heaters 22HS, it becomes possible to more finely control the temperature of the substrate stage 22 and thus the wafer W. The heater 22H serves as a constituent element of the temperature control part 24 (FIG. 1), and the temperature control part 24 may include a temperature regulator that controls the temperature of the heater 22H. With this arrangement, the temperature control part 24 can supply power to the heater 22H on the basis of a temperature signal from the temperature measuring part 23, to keep the substrate stage 22 at a predetermined temperature, for example.

According to the temperature measuring part 23 and the temperature control part 24, it is possible to suppress the temperature of the wafer W from being lowered due to vaporization heat that accompanies evaporation of the immersion liquid IL, for example. That is, when the immersion liquid IL held between the projection part 13 and the wafer W evaporates, the temperature of the wafer W could be lowered due to the vaporization heat at this time. Then, it follows that the wafer W could shrink and deform. The deformation thus caused interferes with the position measurement. However, where the temperature of the wafer W is kept constant by the temperature measuring part 23 and the temperature control part 24, it is possible to prevent the wafer W from deforming due to evaporation of the immersion liquid IL.

Figure 4:
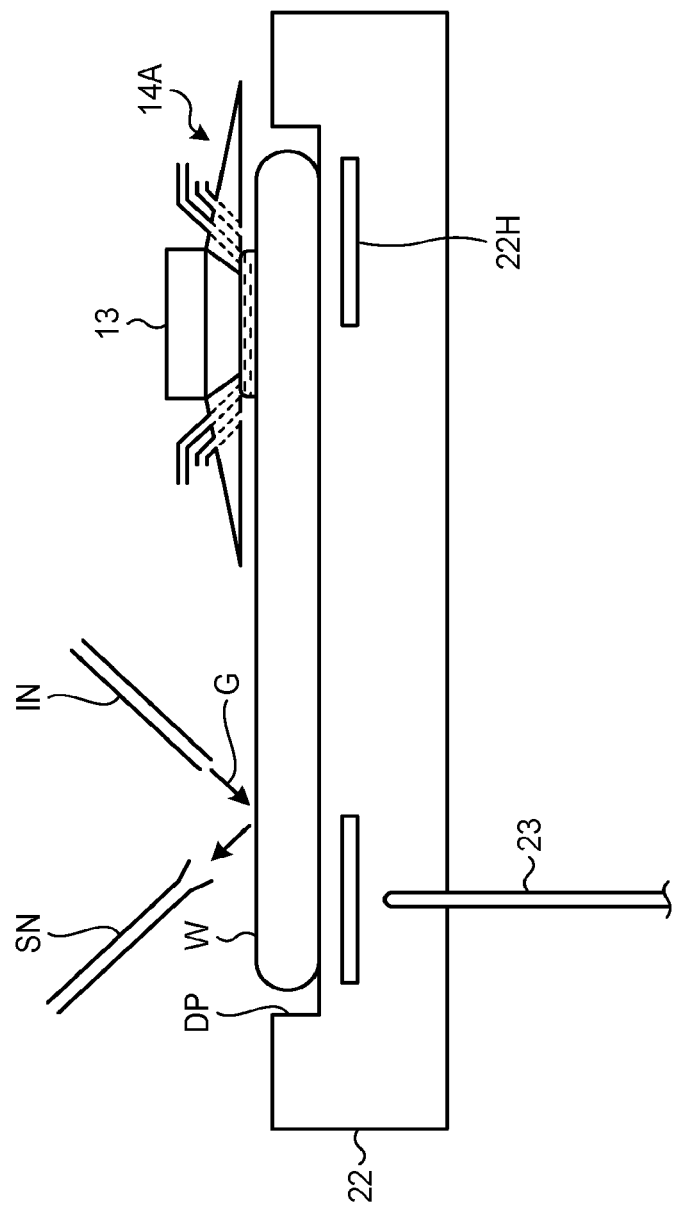
FIG. 4 is a diagram schematically illustrating an injection nozzle and a suction nozzle that sucks gas injected from the injection nozzle, in the position measuring apparatus according to the embodiment.

Further, the position measuring apparatus 1 according to this embodiment may include a blower that blows a gas to the wafer W held on the substrate stage 22. The blower may include a gas cylinder filled with a gas (or, compressors), piping, valves, and so forth (all not illustrated), and may further include, as illustrated in FIG. 4, an injection nozzle IN that is directed toward the upper surface of the wafer W to inject a gas G, and a suction nozzle SN that sucks the gas G injected from the injection nozzle IN. Here, the gas may be exemplified by air (clean and dry air) or an inactive gas (rare gas or nitrogen gas). When the gas is blown from the injection nozzle IN to the wafer W, it is possible to remove the immersion liquid IL, which has been partially or entirely separated from the space between the projection part 13 and the wafer W, on the wafer W.

Here, the position measuring apparatus 1 according to this embodiment may include, instead of the blower, a vibration mechanism that vibrates the wafer W, to remove the immersion liquid IL on the wafer W by vibrating the wafer W. Further, in order to remove the immersion liquid IL, a heater or lamp may be provided.

The position control part 25 includes a moving mechanism (not illustrated) that moves the substrate stage 22 at least in the horizontal plane. In this embodiment, as the position control part 25 moves the substrate stage 22, a relative displacement of the projection part 13 is made with respect to the wafer W. Further, the position control part 25 can move the substrate stage 22 on the basis of the measurement result of the position measuring part 26. The position measuring part 26 includes a laser interferometer, for example. The laser interferometer includes a laser element, a light receiving element, and an optical system. The laser interferometer irradiates the substrate stage 22 with a length measuring beam while splitting the beam into two portions, and obtains information on the position of the substrate stage 22 by utilizing the interference of a return beam reflected on the substrate stage 22. Consequently, the coordinate position of a predetermined portion of the wafer W on the substrate stage 22 is specified on an absolute coordinate system. In the following description, the coordinate position on the absolute coordinate system may be simply referred to as "absolute position". Here, the position control part 25 may include a linear encoder or the like instead of the laser interferometer, to specify the absolute position by the linear encoder.

Control Unit

With reference to FIG. 1 again, the control unit 30 of the position measuring apparatus 1 includes the arithmetic part 31, the instruction part 32, and a storage part 33. The arithmetic part 31 receives signals from the image detection system 10, the position control system 20, and so forth, and performs predetermined arithmetic operations to measure the absolute position of a predetermined portion of the wafer W. Further, the arithmetic part 31 sends instruction signals to the image detection system 10, the position control system 20, and so forth to perform comprehensive control over the position measuring apparatus 1.

Specifically, the arithmetic part 31 sends instruction signals to the imaging part 11 and the illumination part 12 through the instruction part 32, to cause the illumination part 12 to emit the illumination light, and to cause the imaging part 11 to image a circuit pattern of a semiconductor device on the wafer W. When the illumination light is transmitted through the immersion liquid IL, the wavelength of the illumination light is made to be a substantially shorter wavelength. Here, where it is assumed that "λ" denotes the wavelength of the illumination light and "n" denotes the refractive index of the immersion liquid IL, the effective wavelength of light radiated onto the surface of the wafer W through the immersion liquid IL is expressed by λ/n. For example, when green light with a wavelength of 555 nm is used as the illumination light and pure water (with a refractive index of 1.44) is used as the immersion liquid IL, the effective wavelength becomes 385 nm. Although the resolution in optical measurement is expressed by $k_1 \times \lambda/NA$ ($k_1$: process constant, and NA: numerical aperture) according to the Rayleigh equation, the resolution is improved as the wavelength λ is made to be a substantial shorter wavelength.

For example, where circuit patterns of semiconductor memory devices having a three-dimensional structure are formed on the wafer W, each chip area is provided with a memory cell array region and a peripheral circuit region as element regions, for example. In the memory cell array region, a plurality of memory pillars are arranged in each of which a plurality of memory cells are formed. In the peripheral circuit region, elements for controlling the memory cells, such as a row decoder and a sense amplifier, are arranged. The imaging object of the imaging part 11 may be the memory cell array region, for example. As described above, according to this embodiment, since the illumination light is made to have a shorter wavelength by the immersion liquid IL, it is possible to obtain an image of the memory cell array region with high resolution. Specifically, it is possible to grasp the positions of the respective memory pillars in the memory cell array region.

The arithmetic part 31 can determine the absolute positions in the memory cell array region, on the basis of the image signal of the memory cell array region acquired with high resolution as described above and the positional information obtained by the position measuring part 26. The arithmetic part 31 sends the absolute position data thus obtained to the storage part 33, and the storage part 33 stores the absolute position data. The absolute position data stored in the storage part 33 can be sent, for example, to a light exposure apparatus in advance of light exposure for the wafer W, and used for positional alignment between a photomask and the wafer W in the light exposure apparatus.

Figure 5A:
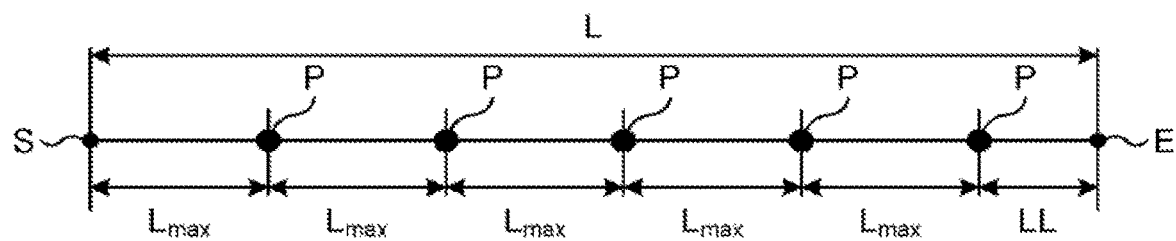
FIGS. 5A and 5B are explanatory diagrams each for explaining an intermittent displacement of a projection part in the position measuring apparatus according to the embodiment.

Further, the arithmetic part 31 can also control the relative displacement of the projection part 13 with respect to the wafer W. When a relative displacement of the projection part 13 is made with respect to the wafer W, there is a case where the immersion liquid IL is not retained between the projection part 13 and the wafer W, and the immersion liquid IL is partly or entirely left behind, for example. In order to prevent this problem, for example, a moving operation is performed such that the projection part 13 repeats a constant distance displacement and a stop. The arithmetic part 31 calculates the number of stops and/or the displacement distance per unit period till each stop to realize this moving operation. For example, it is assumed that Lmax denotes a distance by which the projection part 13 can be displaced while retaining the immersion liquid IL between the projection part 13 and the wafer W, and "L" denotes a distance by which the projection part 13 is to be displaced. For example, Lmax may be obtained by preliminary experiments or the like. The arithmetic part 31 subtracts Lmax from the distance L, and compares the residue with Lmax. When the residue is larger than Lmax, the arithmetic part 31 further subtracts Lmax from the residue. Thereafter, this subtraction is repeated until the residue becomes smaller than Lmax. When the residue becomes smaller than Lmax, the arithmetic part 31 can determine the number of subtractions to be the number of stops. On the basis of this, the arithmetic part 31 causes the position control part 25 to move the substrate stage 22. Accordingly, as illustrated in FIG. 5A, the projection part 13 repeats being displaced only by the distance Lmax and then stopped at a point P, and is finally displaced only by a distance LL corresponding to the residue smaller than Lmax. As a result, the projection part 13 can be displaced from the start point S to the end point E, which is away from the start point S by the distance L, while retaining the immersion liquid IL. Here, when the distance L is smaller than Lmax, the number of stops is zero, and the projection part 13 can be displaced by the distance L shorter than Lmax without any stop.

Figure 5B:
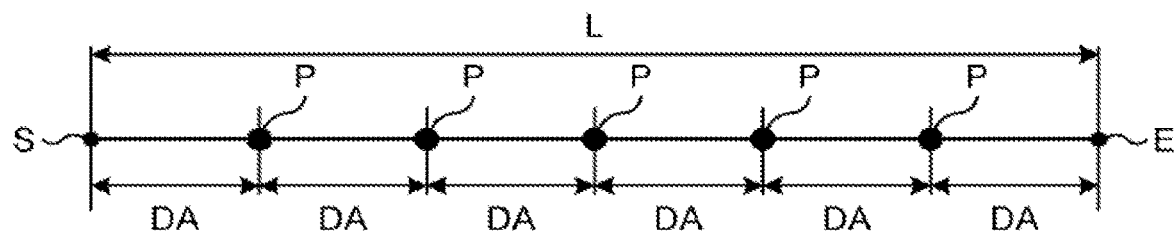

Alternatively, the arithmetic part 31 may determine L/Lmax to be the number of stops, and divide the distance L by this number of stops, to obtain the displacement distance per unit period till each stop. When the quotient of L/Lmax is not a natural number (the distance L is not a natural number multiple of Lmax), a natural number larger than this quotient may be determined to be the number of stops, or a value obtained by rounding up the quotient to the nearest whole number may be determined to be the number of stops. The distance L is divided by the number of stops thus obtained, so that an average displacement distance per unit period, which is not larger than Lmax, can be obtained. On the basis of this, the arithmetic part 31 causes the position control part 25 to move the substrate stage 22. Accordingly, as illustrated in FIG. 5B, the projection part 13 repeats being displaced by the average displacement distance DA per unit period and then stopped at a point P. As a result, the projection part 13 can be displaced from the start point S to the end point E, which is away from the start point S by the distance L.

The arithmetic part 31 may be realized by hardware, such as an application specific integrated circuit (ASIC), programmable gate array (PGA), field programmable gate array (FPGA). Alternatively, the arithmetic part 31 may be realized as a computer including CPU, ROM, RAM, and so forth. The arithmetic part 31 performs comprehensive control over the position measuring apparatus 1, on the basis of a control program and various data. Specifically, the arithmetic part 31 generates various instruction signals on the basis of the control program and the various data, and sends the instruction signals thus generated to the respective parts of the image detection system 10 and/or the position control system 20, to control these parts. For example, the program and the various data can be downloaded by wire or wireless means from a non-transitory computer-readable storage medium, such as a hard disk drive (HDD), semiconductor memory, or server.

As described above, in the position measuring apparatus 1 according to this embodiment, the immersion liquid IL is retained in the space between the projection part 13 and the wafer W, while a circuit pattern formed on the surface of the wafer W is imaged by the imaging part 11. This makes it possible to obtain an image signal with high resolution. Consequently, on the basis of the image signal with high resolution and positional information from the position measuring part 26, it is possible to specify the absolute position of a predetermined portion or constituent element in the circuit pattern with high accuracy.

Further, in the position measuring apparatus 1 according to this embodiment, the liquid immersion part 14 includes the conduits 14GC for gas, through which a gas can be sprayed to the outer circumference of the immersion liquid IL. This makes it possible to easily hold the immersion liquid IL in the space between the projection part 13 and the wafer W. Consequently, it is possible to displace the projection part 13 with a relatively high speed while retaining the immersion liquid IL, and thereby to shorten the time for the position measurement.

Further, in the position measuring apparatus 1 according to this embodiment, in order for the projection part 13 to be displaced while retaining the immersion liquid IL in the space between the projection part 13 and the wafer W, the arithmetic part 31 can cause the projection part 13 to be displaced intermittently, i.e., by repeating a predetermined distance displacement and a temporal stop. This also makes it possible to displace the projection part 13 with a relatively high speed while retaining the immersion liquid IL.

Furthermore, there is a case where the immersion liquid IL is partly or entirely left behind during displacement of the projection part 13. Even in such a case, since the position measuring apparatus 1 according to this embodiment is provided with the injection nozzle IN, the immersion liquid IL thus left behind can be blown off or dried by the gas injected from the injection nozzle IN toward the wafer W. This makes it possible to prevent watermarks from being generated by the immersion liquid IL, and to keep the surface of the wafer W clean. Further, since the immersion liquid IL left behind is blown off and dried, the temperature of the wafer W can be less changed due to vaporization heat. This makes it possible to prevent the accuracy of the position measurement from being lowered due to a temperature change of the wafer W.

Further, in the position measuring apparatus 1 according to this embodiment, the substrate stage 22 is provided with the heater 22H, by which the temperature of the wafer W can be suppressed from being lowered due to vaporization heat that accompanies evaporation of the immersion liquid IL. This also makes it possible to prevent the accuracy of the position measurement from being lowered due to a temperature change of the wafer W.

Position Measuring Method

Next, an explanation will be given of a position measuring method according to the embodiment. This position measuring method can be performed by the position measuring apparatus 1 described above. First, a wafer W is transferred by the substrate transfer part 21, and is mounted onto the substrate stage 22. The Wafer W is held by a predetermined chuck in the depressed portion DP of the substrate stage 22. Then, the projection part 13 is set up above and near the wafer W, and a liquid, such as pure water, is supplied into the space between the projection part 13 and the wafer W from the liquid immersion part 14 through the attachment 14A. The liquid thus supplied is retained between the projection part 13 and the wafer W as the immersion liquid IL. Further, a gas, such as clean and dry air, is sprayed to the circumference of the immersion liquid IL from the liquid immersion part 14 through the attachment 14A.

Then, the substrate stage 22 is moved by the position control part 25, so that a relative displacement of the projection part 13 is made with respect to the wafer W. At this time, control may be performed such that the projection part 13 is displaced chip by chip in a step-and-repeat manner together with the immersion liquid IL while the projection part 13 is kept present above and near the wafer W. Further, when a predetermined number of chips have been selected in advance as imaging objects from the chips on the wafer W, control may be performed such that the projection part 13 is displaced together with the immersion liquid IL from a position above one imaging object chip to a position above another imaging object chip. In this case, it is desirable to perform a moving operation such that the projection part 13 repeats a displacement and a temporary stop, as explained with reference to FIGS. 5A and 5B, for example.

When the projection part 13 comes to rest above the chip on the wafer W, during the moving operation described above, the imaging part 11 images a predetermined circuit pattern (for example, the memory cell array region) in the chip, and generates an image signal of this circuit pattern. The image signal is sent from the imaging part 11 through the instruction part 32 to the arithmetic part 31.

On the other hand, the position of the substrate stage 22 moved by the position control part 25 is measured by the position measuring part 26. The measurement result serving as positional information is sent from the position measuring part 26 to the arithmetic part 31. The arithmetic part 31 determines the absolute position of each chip, on the basis of the image signal from the imaging part 11 and the positional information from the position measuring part 26.

Modification

In the embodiment descried above, the attachment 14A provided with the conduits 14LC for liquid and the conduits 14GC for gas is attached to the projection part 13. The immersion liquid IL is supplied from the conduits 14LC into the space between the projection part 13 and the wafer W, and the gas is supplied from the conduits 14GC to the circumference of the immersion liquid IL. However, instead of using the attachment 14A, a configuration may be adopted that includes nozzles alternative to the conduits 14LC and nozzles alternative to the conduits 14GC.

Further, the heater 22H is composed of the eight sub-heaters 22HS, but the number of sub-heaters 22HS may be arbitrarily determined. Further, the heater 22H has an annular shape as a whole, but may have a circular shape. In this case, the circular heater may be composed of a plurality of sub-heaters each having a fan shape, for example.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A position measuring apparatus comprising:
   a substrate stage configured to hold a substrate including at least part of a circuit pattern;
   a projection device configured to irradiate the substrate held on the substrate stage with illumination light, and to transmit reflected light from the substrate, of the illumination light radiated on the substrate;
   a liquid supply device configured to supply a liquid into a space between the substrate held on the substrate stage and the projection device;
   an imaging device configured to receive the reflected light transmitted through the projection device, and to generate an image signal based on the reflected light;
   an interferometer configured to obtain positional information on a position of the substrate stage; and
   a control circuitry configured to determine a coordinate position of the at least part of a circuit pattern in the substrate, on a basis of the positional information and the image signal,
   wherein the liquid supply device includes an attachment that can be attached to the protection device,
   the attachment is provided with a first conduit for liquid and a second conduit for gas,
   in the attachment, the first conduit is arranged on the inner side with respect to the second conduit,
   the liquid supply device supplies the liquid from a liquid storage container through the first conduit into the space,
   the attachment is provided with at least the two first conduits to supply the liquid through one of the first conduits and discharge the liquid through the other, and
   a state of the space is switched as required between a state where the liquid is present therein and a state where the liquid is not present therein.

2. The position measuring apparatus according to claim 1, further comprising a liquid holding device configured to hold the liquid supplied in the space.

3. The position measuring apparatus according to claim 2, wherein the liquid holding device includes piping configured to spray a gas toward the space.

4. The position measuring apparatus according to claim 1, further comprising a position controller configured to displace the projection device with respect to the substrate,
   wherein the control circuitry is configured to control the position controller to displace the projection device with respect to the substrate while retaining the liquid in the space.

5. The position measuring apparatus according to claim 4, wherein the control circuitry is configured to displace the projection device with respect to the substrate intermittently.

6. The position measuring apparatus according to claim 4, further comprising a blowing device configured to blow a gas to the substrate after displacement of the projection device.

7. The position measuring apparatus according to claim 4, further comprising a vibrating device configured to vibrate the substrate after displacement of the projection device.

8. The position measuring apparatus according to claim 4, further comprising a heater configured to heat the substrate after displacement of the projection device.

9. The position measuring apparatus according to claim 1, wherein the substrate stage includes a temperature control device.

10. The position measuring apparatus according to claim 1, wherein the liquid has a refractive index larger than a refractive index of air.

11. A position measuring method comprising:
    holding a substrate including at least part of a circuit pattern onto a substrate stage;
    supplying a liquid into a space between the substrate held on the substrate stage and a projection device configured to irradiate the substrate with illumination light;
    irradiating the substrate with the illumination light from the projection device through the liquid;
    receiving reflected light from the substrate by an imaging device through the liquid, and generating an image signal based on the reflected light;
    obtaining positional information on a position of the substrate stage; and
    determining a coordinate position of the at least part of a circuit pattern in the substrate, on a basis of the positional information and the image signal,
    wherein the liquid supply device includes an attachment that can be attached to the projection device,
    the attachment is provided with a first conduit for liquid and a second conduit for gas,
    in the attachment, the first conduit is arranged on the inner side with respect to the second conduit, the liquid supply device supplies the liquid from a liquid storage container through the first conduit into the space, the attachment is provided with at least the two first conduits to supply the liquid through one of the first conduits and discharge the liquid through the other, and a state of the space is switched as required between a state where the liquid is present therein and a state where the liquid is not present therein.

12. The position measuring method according to claim 11, wherein the method comprises holding the liquid supplied in the space.

13. The position measuring method according to claim 12, wherein the holding the liquid includes spraying a gas toward the space.

14. The position measuring method according to claim 11, wherein the method comprises displacing the projection device with respect to the substrate, and the displacing the projection device includes displacing the projection device with respect to the substrate while retaining the liquid in the space.

15. The position measuring method according to claim 14, wherein the method comprises displacing the projection device with respect to the substrate intermittently.

16. The position measuring method according to claim 14, wherein the method comprises blowing a gas to the substrate after displacement of the projection device.

17. The position measuring method according to claim 14, wherein the method comprises vibrating the substrate after displacement of the projection device.

18. The position measuring method according to claim 14, wherein the method comprises heating the substrate after displacement of the projection device.

19. The position measuring method according to claim 11, wherein the substrate stage includes a temperature control device.

20. The position measuring method according to claim 11, wherein the liquid has a refractive index larger than a refractive index of air.

* * * * *